United States Patent
Shimanskiy

(10) Patent No.: US 7,847,651 B2
(45) Date of Patent: Dec. 7, 2010

(54) METHOD OF AND APPARATUS TO GENERATE PULSE WIDTH MODULATED SIGNAL FROM SAMPLED DIGITAL SIGNAL BY CHAOTIC MODULATION

(75) Inventor: Vladislav Shimanskiy, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 791 days.

(21) Appl. No.: 11/762,388

(22) Filed: Jun. 13, 2007

(65) Prior Publication Data

US 2007/0291833 A1    Dec. 20, 2007

Related U.S. Application Data

(60) Provisional application No. 60/804,662, filed on Jun. 14, 2006.

(30) Foreign Application Priority Data

Sep. 26, 2006    (KR) ...................... 10-2006-0093731

(51) Int. Cl.
    *H03K 7/08*    (2006.01)

(52) U.S. Cl. ...................................... 332/109; 375/238
(58) Field of Classification Search ......... 332/109–111; 327/172–177; 363/26, 41; 375/238
See application file for complete search history.

(56) References Cited

U.S. PATENT DOCUMENTS

| 6,473,457 | B1 * | 10/2002 | Pascual et al. ............... 375/238 |
| 6,600,669 | B2 * | 7/2003 | Trzynadlowski et al. ...... 363/41 |
| 2004/0192234 | A1 | 9/2004 | Glenn, Sr. et al. |

* cited by examiner

*Primary Examiner*—David Mis
(74) *Attorney, Agent, or Firm*—Stanzione & Kim, LLP

(57) ABSTRACT

A method and apparatus to generate a pulse width modulated signal from a sampled digital signal by chaotic modulation. The method includes generating predetermined chaotic intervals having random interval values using a chaotic interval generator, and generating the pulse width modulated signal from a reference signal and the sampled digital signal during each of the chaotic intervals. Thus, electromagnetic interference (EMI) that affects an audio amplifier can be remarkably reduced.

19 Claims, 7 Drawing Sheets

METHOD OF AND APPARATUS TO GENERATE PULSE WIDTH MODULATED SIGNAL FROM SAMPLED DIGITAL SIGNAL BY CHAOTIC MODULATION

CROSS-REFERENCE TO RELATED APPLICATIONS

This application claims priority under 35 U.S.C. §119(a) from Korean Patent Application No. 10-2006-0093731, filed on Sep. 26, 2006, in the Korean Intellectual Property Office, and U.S. Patent Application No. 60/804,662, filed on Jun. 14, 2006, in the U.S. Patents and Trademark Office, the disclosures of which are incorporated herein in their entirety by reference.

BACKGROUND OF THE INVENTION

1. Field of the Invention

The present general inventive concept relates to a method of and apparatus to generate a pulse width modulated (PWM) signal from a sampled digital signal by a chaotic modulation, wherein the method includes generating predetermined chaotic intervals having random durations using a chaotic interval generator and generating the PWM signal from a reference signal and the sampled digital signal.

2. Description of the Related Art

Pure digital amplifiers are becoming a key component of modern audio systems, for home and mobile use. The main advantages of digital amplification are high efficiency in power delivery to speakers and excellent stereo performance.

Pure digital amplifiers can receive and convert a digital audio stream into a high power pulse signal to drive a speaker directly without the use of an active circuit. Usually, a demodulating LC-filter intended to remove high frequency signal components is placed before the speaker. Pulse width modulation (PWM) is the most common and suitable technique to generate a pulse stream. There are many publications devoted to the principles and design problems of PWM pure digital amplifiers.

According to the above conventional technology, an output signal of a PWM modulator has a series of high frequency harmonics along with a mixture of an audio-band signal and noise shaper components, and furthermore, causes electromagnetic interference (EMI).

SUMMARY OF THE INVENTION

The present general inventive concept provides a practical approach to reduce high frequency harmonics affecting a demodulation filter and decreasing electromagnetic compatibility issues.

The present general inventive concept also provides a method and apparatus to generate a pulse width modulated signal which can remarkably decrease electromagnetic interference (EMI) that affects an audio amplifier.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a method of generating a pulse width modulated signal from a sampled digital signal by chaotic modulation, the method including generating a plurality of predetermined chaotic intervals having random interval values using a chaotic interval generator, and generating the pulse width modulated signal from a reference signal and the sampled digital signal during each of the plurality of chaotic intervals.

The generating of the pulse width modulated signal may include calculating maximum values of the reference signal for each of the plurality of chaotic intervals and generating the reference signal by counting the maximum values, and generating the pulse width modulated signal by comparing the reference signal and the sampled digital signal.

The reference signal may be a saw tooth signal. The sampled digital signal can be a noise-shaped digital signal output from a noise shaper.

The average of the chaotic intervals can be equal to one period of a single-sided pulse width modulated signal which has a regular period. Each period of the chaotic intervals may be calculated using a difference between one period of a single-sided pulse width modulated signal which has a regular period and a period of each of the plurality of chaotic intervals.

The chaotic interval generator can be a secondary infinite impulse response (IIR) filter.

The foregoing and/or other aspects and utilities of the present general inventive concept may also be achieved by providing an apparatus to generate a pulse width modulated signal from a sampled digital signal by chaotic modulation, the apparatus including a chaotic interval generator to generate a plurality of predetermined chaotic intervals having random interval values and a pulse width modulation signal generator to generate the pulse width modulated signal from a reference signal and the sampled digital signal during each of the plurality of chaotic intervals.

The chaotic interval generator can calculate maximum values of the reference signal for each of the plurality of chaotic intervals, the pulse width modulation signal generator can include a counter to generate the reference signal from the maximum values of the reference signal and an adder to generate the pulse width modulated signal by comparing the reference signal and the sampled digital signal, and the reference signal can be generated by counting the maximum value of the reference signal according to a predetermined reference clock.

The sampled digital signal can be a noise-shaped digital signal output from a noise shaper.

An average of the plurality of chaotic intervals may be equal to one period of a single-sided pulse width modulated signal which has a regular period. Each period of the plurality of chaotic intervals may be calculated using a difference between one period of a single-sided pulse width modulated signal which has a regular period and a period of each of the plurality of chaotic intervals.

The chaotic interval generator can be a secondary IIR filter.

The foregoing and/or other aspects and utilities of the present general inventive concept may also be achieved by providing a computer readable recording medium containing computer readable codes to perform a method of generating a pulse width modulated signal from a sampled digital signal by chaotic modulation, the method including generating a plurality of predetermined chaotic intervals having random interval values using a chaotic interval generator and generating the pulse width modulated signal from a reference signal and the sampled digital signal during each of the plurality of chaotic intervals.

The foregoing and/or other aspects and utilities of the present general inventive concept may also be achieved by providing a method of generating a pulse width modulation (PWM) signal, the method including receiving a sampled data signal, calculating a chaotic interval; generating a reference signal corresponding to the calculated chaotic interval, and generating a PWM signal based on the reference signal and the sampled data signal.

The foregoing and/or other aspects and utilities of the present general inventive concept may also be achieved by providing pulse width modulation converting apparatus including an upsampler to generate a sampled digital signal from an input stream, a natural sampling converter to convert the sampled digital signal into a natural sampled digital signal, a noise shaper to quantize the natural sampled digital signal to a quantized stream and a pulse width modulation (PWM) converter to generate a digital stream from the quantized stream.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
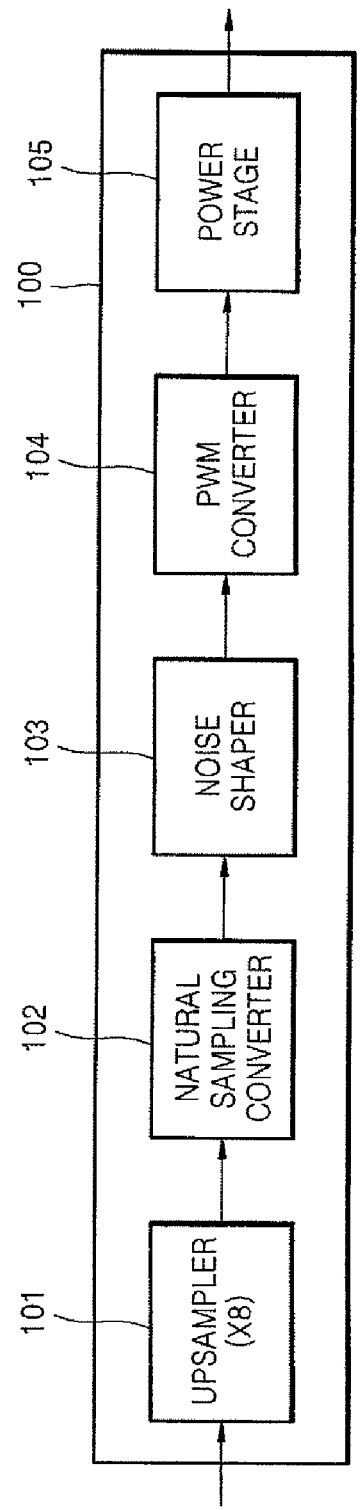
FIG. 1 is a block diagram illustrating a pulse width modulation (PWM) converting apparatus according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a block diagram illustrating a pulse width modulation (PWM) converting apparatus 100 according to an embodiment of the present general inventive concept. The PWM converting apparatus includes an upsampler 101, a natural sampling converter 102, a noise shaper 103, a PWM converter 104, and a power stage 105.

Referring to FIG. 1, the upsampler 101 generates a sampled digital signal, for example, by increasing a sampling frequency of an input stream to a sampling frequency of a pulse width modulated signal. This widens a frequency band and is required for a straight noise shaper operation. The sampling frequency of the PWM converting apparatus is Fc=384 kHz=8*48 kHz.

The natural sampling converter 102 performs an interpolation procedure by converting a sampled digital signal into a natural sampled digital signal in order to estimate an actual value of an input audio signal, between given samples. Here, in a uniformly sampled stream, an audio band of pulse width modulated signals can be generated free from unwanted components generated in a digital domain. Thus, the system performance is significantly improved.

Referring to FIG. 1, the noise shaper 103 quantizes the input stream down to a quantized stream, for example, with an acceptable level of bit precision and transfers quantization noise from an audible spectrum zone to a high frequency band. In an embodiment of the present general inventive concept, data initially having 20-bit precision can be quantized down to an 8-bit stream. The input stream, for example, can be quantized by quantizing the natural sampled digital signal output from the natural sampling converter 102.

The PWM converter 104 receives the quantized stream from the noise shaper 103 and, for example, generates a new 1-bit digital stream (per channel) having 8-bit precision, for every sample going on Fc rate. Accordingly, a minimum requirement for the clock frequency is as follows.

$$F'_{clk} = 2^8 F_c = 98.304 \text{ MHz.} \quad (1)$$

The pulse width modulated signal output from the PWM converter 104 is amplified and then output to the power stage 105.

Figure 2:
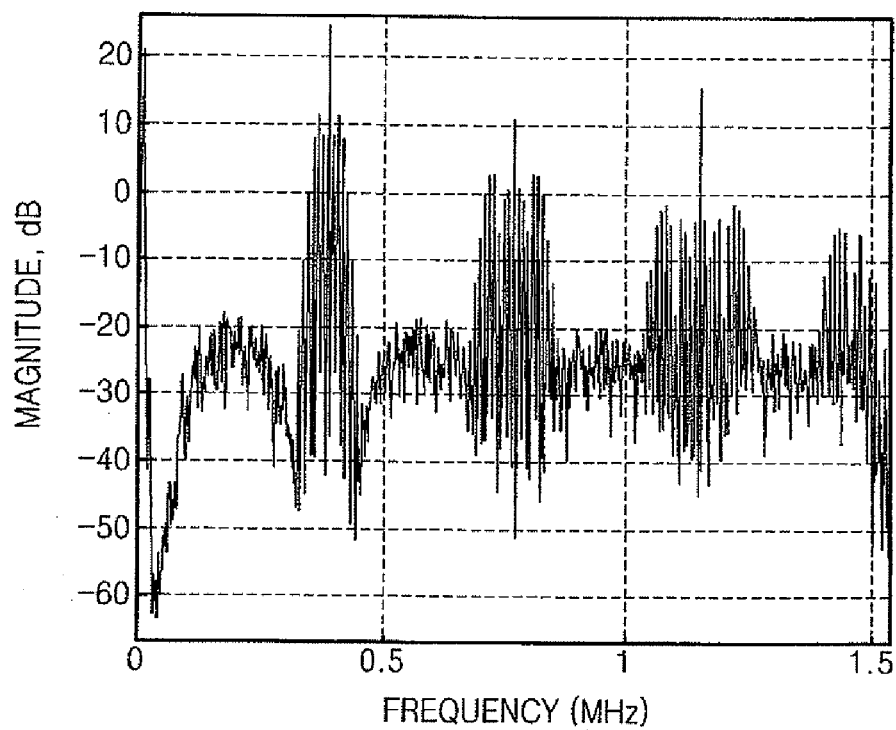
FIG. 2 illustrates a high frequency harmonic spectrum output at an output terminal of a PWM converter of FIG. 1 according to an embodiment of the present general inventive concept.

FIG. 2 illustrates a high frequency harmonic spectrum output at an output terminal of the PWM converter 104 of FIG. 1 according to an embodiment of the present general inventive concept. Referring to FIG. 2, an output signal of the PWM converter 104 has a series of high frequency harmonics with a mixture of audio-band signal and noise shaper components. A demodulation filter should suppress all frequencies except audible frequencies.

Modulation Scheme

Figure 3:
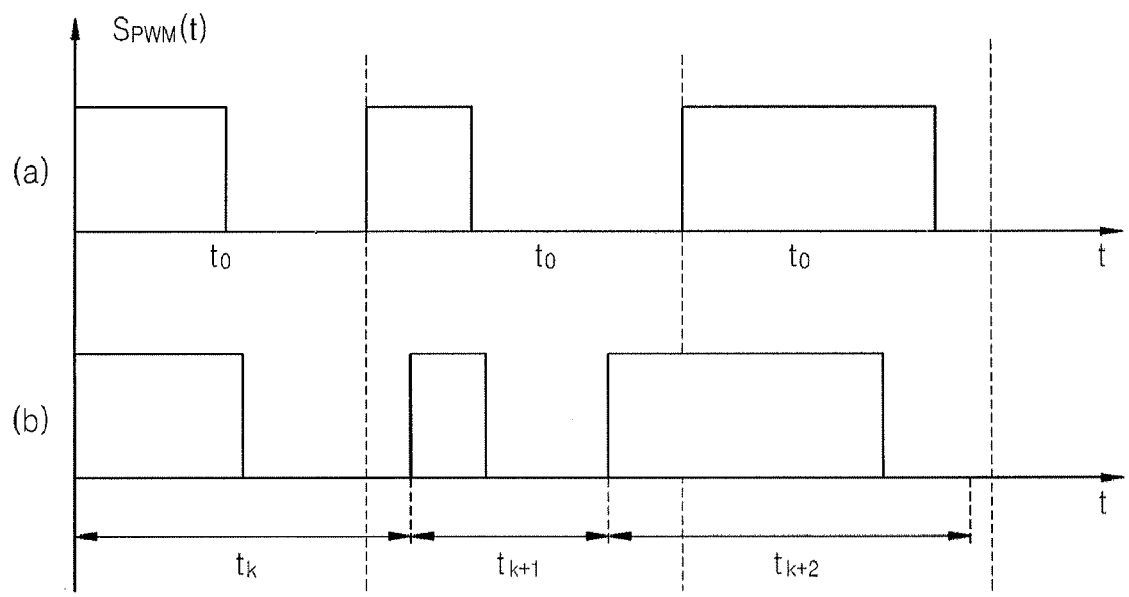
FIG. 3 is a diagram illustrating (a) normal SPWM streams and (b) spread PWM streams according to an embodiment of the present general inventive concept.

FIG. 3 is a diagram illustrating (a) normal single-sided PWM (SPWM) streams and (b) spread PWM streams that illustrate several periods of signals. The periods have equal duration and are filled with pulses having widths, which are determined by sound sample values. In an embodiment of the present general inventive concept, spreading brings randomness to sampling PWM intervals. Duration $t_o = Fc^{-1}$ is mapped as a new duration of a given duration $t_k$, wherein k denotes a number of data samples. The given duration $t_k$ should satisfy Equation 2 below in order to conform to a balance condition.

$$\lim_{k \to \infty} \frac{1}{k} \sum_k t_k = t_0. \quad (2)$$

That is, an average duration of a shaky interval, i.e. a chaotic interval, should be the same as the original one.

In order to maintain 8-bit precision of pulse width modulated pulses in interval shrinking, a clock frequency of the PWM converter 104 needs to be increased. The maximum value of $t_{max} = \max |t_k - t_0|$ provides the following requirement.

$$F_{clk} = \left(1 + \frac{t_{max}}{t_0}\right) F'_{clk}. \quad (3)$$

Figure 4A:
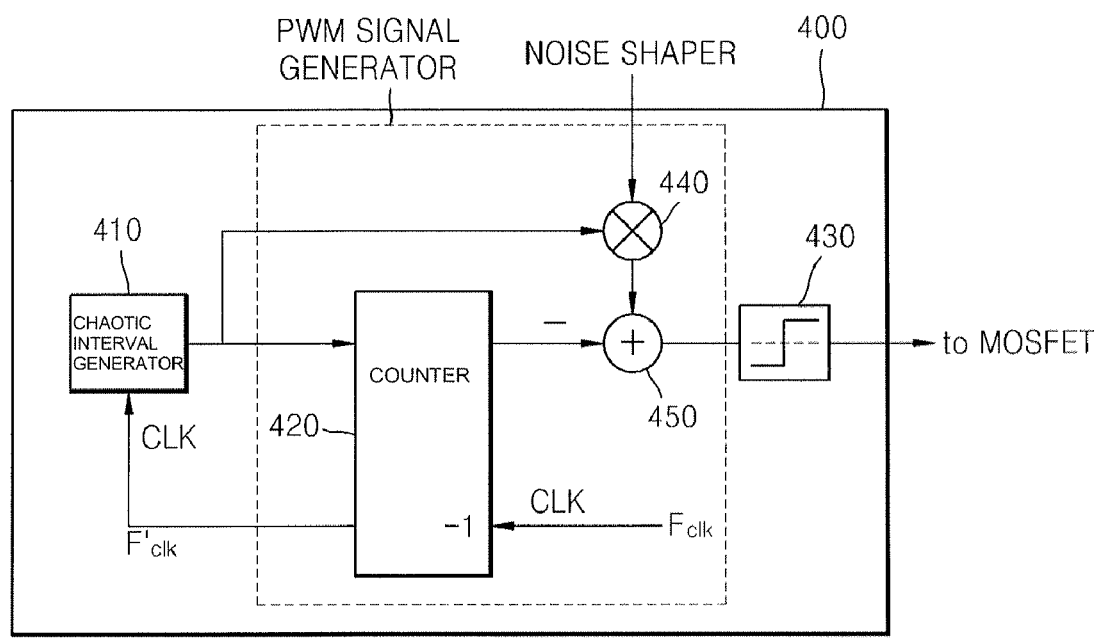
FIG. 4A is a block diagram illustrating the PWM converter of FIG. 1 according to an embodiment of the present general inventive concept.

FIG. 4A is a block diagram illustrating the PWM converter 104 of FIG. 1 according to an embodiment of the present general inventive concept. The PWM converter 104 includes a chaotic interval generator 410 having output data proportional to $t_k$, a counter 420, a multiplier 440, an adder 450, and a signum function (sign( )) 430.

$$T_k = 2^8 \frac{t_k}{t_0}, \, t_k = t_0 + y_k \tau_{max}, \quad (4)$$

In Equation 4 above, $y_k$ is an output of the chaotic interval generator 410 which will be described later. A $T_k$ value is transferred to a load port of the counter 420 counting down by a clock $F_{clk}$. The chaotic interval generator 410 is driven by a counter zero condition in relation to a clock. For example, the chaotic interval generator 410 generates new data $T_k$ whenever time of the counter 420 expires. Then, the generated data $T_k$ is provided to the counter 420.

According to the embodiment of FIG. 4A, a saw tooth signal having a predetermined number of steps is generated, and the saw tooth signal is compared, for example, by an adder 450, with weighted audio data output from a noise shaper block. After applying the adder 450 and the signum function 430, a chaotic modulated pulse width modulated stream is prepared to drive, for example, a metal-oxide semiconductor field effect transistor (MOSFET) switching device.

Chaotic Interval Generator

Figure 4B:
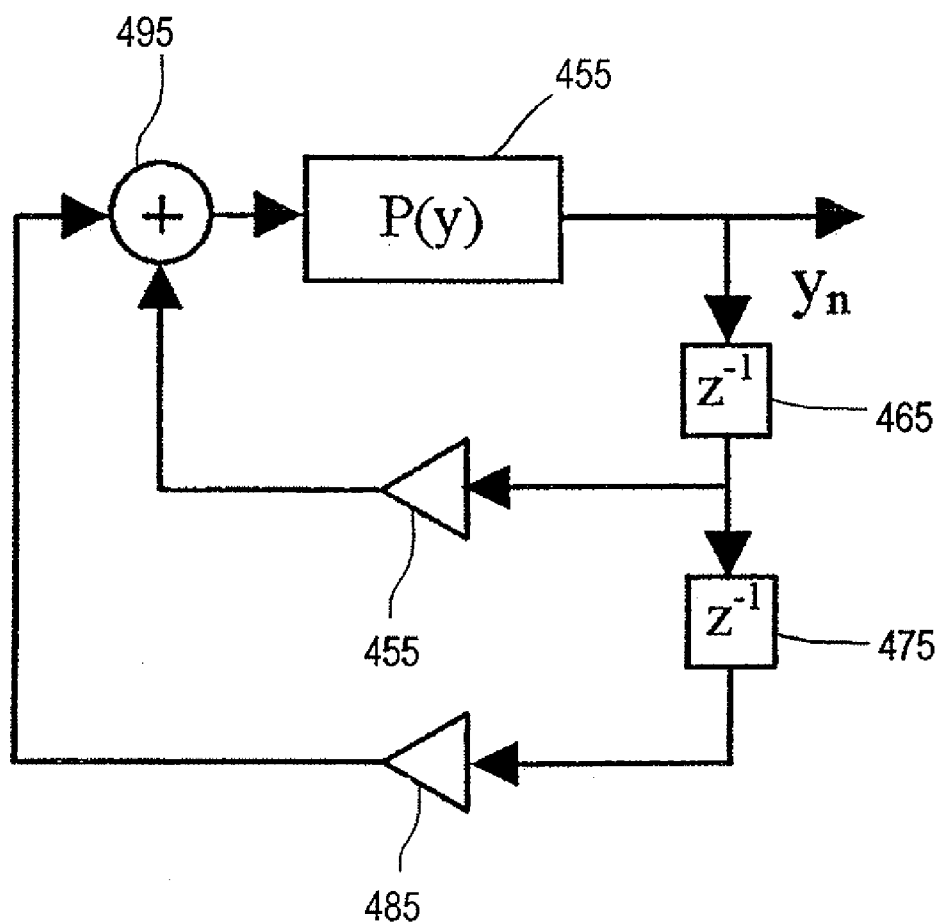
FIG. 4B is a diagram illustrating a chaotic interval generator such as, for example, a digital oscillator according to an embodiment of the present general inventive concept.

FIG. 4B is a diagram illustrating an exemplary embodiment of the chaotic interval generator 410 such as, for example, a digital oscillator according to an embodiment of the present general inventive concept.

Referring to FIG. 4B, the chaotic interval generator 410 according to this embodiment is originally a nonlinear digital filter in an auto-oscillation mode (a digital oscillator). In an embodiment of the present general inventive concept, the chaotic interval generator 410 can also be, for example, a secondary infinite impulse response (IIR) filter. The chaotic interval generator 410 can also be referred to as a chaotic oscillator. As illustrated in FIG. 4B, the chaotic oscillator 410 can include, for example, a functional block 455, invertors 465 and 475, buffers 455 and 485 and an adder 495. The first buffer 455 can have a parameter "a" and the second buffer can have a parameter "b". The buffers 455 and 485 can be, for example, delays. The chaotic interval generator 410 of FIG. 4B follows the below mathematical model.

$$y_n = P(a y_{n-1} + b y_{n-2}), \quad (5)$$
$$P(y) = y - 2 \left\lfloor \frac{y+1}{2} \right\rfloor,$$

Accordingly, P(y) is a function like a saw tooth, and a sign $\lfloor \, \rfloor$ denotes a floor function. P(y) naturally increases with fixed point implementation of digital filters, when a complement number representation of 2 is used. The digital oscillator 410 of FIG. 4B has various different regular modes, such as a limit cycle and a chaotic mode.

In an embodiment of the present general inventive concept, the digital oscillator 410 generates a signal having minimum frequency components lying on an audio band. Accordingly, a suitable chaotic mode with parameters {a=0.01, b=−1.008, $y_{-2}$=0.99085, $y_{-1}$=0.998278} is selected. An additional low pass filtering of a signal provided by the chaotic interval generator 410 can increase performance of a system in the audio band.

Spectrum Spreading

Figure 5:
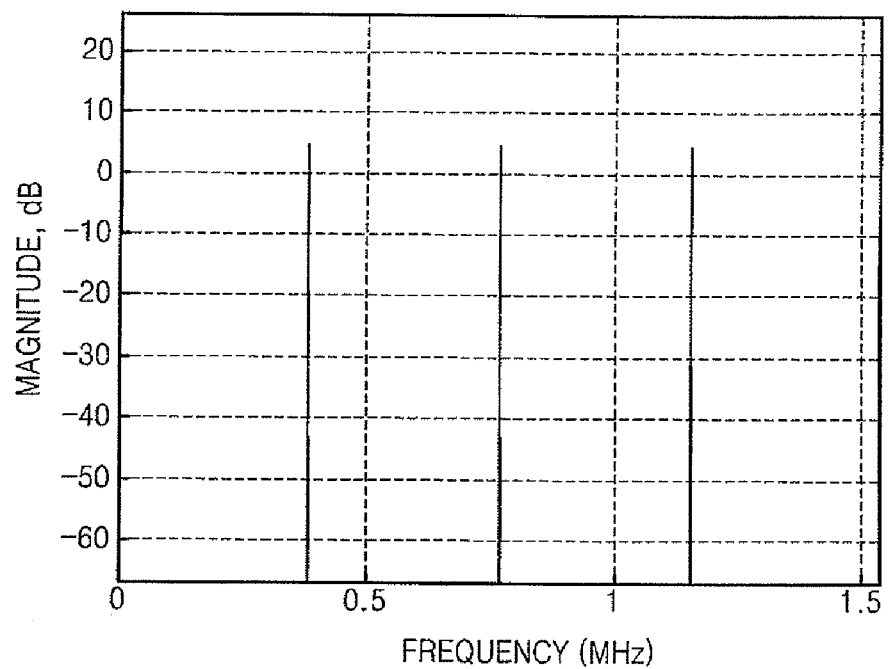
FIG. 5 is a diagram illustrating original PWM spectrum when a DC signal is input according to an embodiment of the present general inventive concept.
Figure 6:
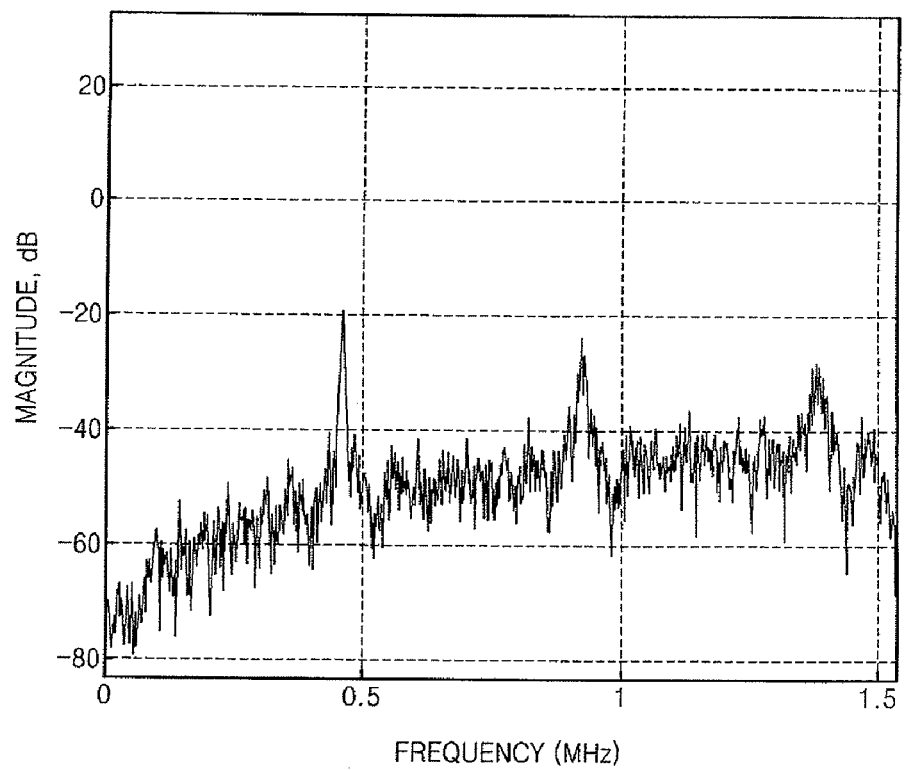
FIG. 6 is a diagram illustrating spread PWM spectrum when a DC signal is input according to an embodiment of the present general inventive concept.

Simulation results are illustrated in FIGS. 5 and 6 according to an embodiment of the present general inventive concept. FIG. 5 is a diagram illustrating an original PWM spectrum when a direct current (DC) signal is input and FIG. 6 is a diagram illustrating a spread PWM spectrum when a DC signal is input.

FIG. 5 depicts an original PWM spectrum performance. A constant signal from the noise shaper 103 is input instead of a regular audio signal in order to simplify and more clearly illustrate the spectrum analysis.

The spread PWM spectrum includes point lines having nFc frequencies. As illustrated in FIG. 6, after spreading, main high frequency harmonics are significantly suppressed and pulse width modulated signal energy is distributed throughout the entire range.

Figure 7:
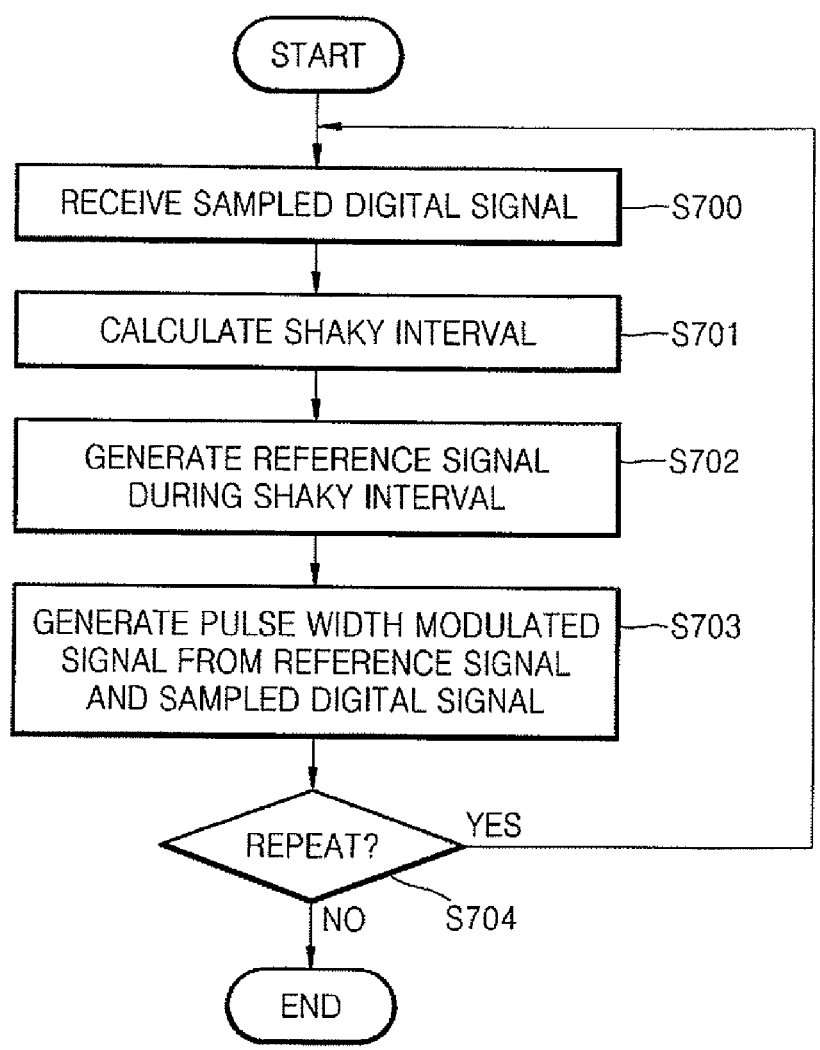
FIG. 7 is a flowchart illustrating a method of converting a sampled digital signal into a PWM signal by chaotic modulation according to an embodiment of the present general inventive concept.

FIG. 7 is a flowchart illustrating a method of converting a sampled digital signal into a PWM signal by chaotic modulation according to an embodiment of the present general inventive concept.

In operation S700, a sampled digital signal is received. In an embodiment of the present general inventive concept, the sampled digital signal is a noise-shaped digital signal from a noise shaper.

In operation S701, a chaotic interval, which is a shaky interval, is calculated, for example, using Equations 2 and 4.

In operation S702, a saw tooth signal, i.e. a reference signal, is generated during the chaotic interval. In the embodiment, the maximum value $T_k$ of the reference signal, that is a $Y_k$ value according to Equation 5, is calculated using Equation 4. When an output of a counter is S(n), the following procedure is taken.

In a predetermined k, S(0)=$T_k$; S(n+1)=S(n)−1; if S(n)=0, k:=k+1. Thus, $F_{clk}$ can increase the counting speed of n.

In operation S703, a pulse width modulated signal is generated from the saw tooth signal, i.e. the reference signal, and the sampled digital signal. The generated pulse width modulated signal is output after application of a signum function in operation S704, and operations S700 through S704 are performed on all sampled digital signals.

As described above, the present general inventive concept provides a practical approach to reduce high frequency harmonics effecting a demodulation filter and decreasing electromagnetic compatibility issues. That is, by using non-periodic pulse position spreading in time domain where a predetermined period is selected from a digital oscillator in a chaotic mode, analog demodulation performance can be improved and filters can be protected from nonlinear effects caused by concentrated high frequency harmonics.

Also, the present general inventive concept can remarkably decrease an electromagnetic interference (EMI) that affects an audio amplifier, and is advantageous in removing lumped high frequency components from a PWM spectrum reducing an electromagnetic compatibility (EMC) performance of a digital amplifier.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of generating a pulse width modulated signal from a sampled digital signal by chaotic modulation, the method comprising:
generating a plurality of predetermined chaotic intervals having random interval values using a chaotic interval generator; and
generating the pulse width modulated signal from a reference signal and the sampled digital signal during each of the plurality of chaotic intervals.

2. The method of claim 1, wherein the generating of the pulse width modulated signal comprises:
calculating maximum values of the reference signal for each of the plurality of chaotic intervals and generating the reference signal by counting the maximum values; and
generating the pulse width modulated signal by comparing the reference signal and the sampled digital signal.

3. The method of claim 1, wherein the reference signal is a saw tooth signal.

4. The method of claim 1, wherein the sampled digital signal is a noise-shaped digital signal output from a noise shaper.

5. The method of claim 1, wherein an average of the plurality of chaotic intervals is equal to one period of a single-sided pulse width modulated signal which has a regular period.

6. The method of claim 1, wherein each period of the chaotic intervals is calculated using a difference between one period of a single-sided pulse width modulated signal which has a regular period and a period of each of the chaotic intervals.

7. The method of claim 1, wherein the chaotic interval generator is a secondary infinite impulse response (IIR) filter.

8. An apparatus to generate a pulse width modulated signal from a sampled digital signal by chaotic modulation, the apparatus comprising:
a chaotic interval generator to generate a plurality of predetermined chaotic intervals having random interval values; and
a pulse width modulation signal generator to generate the pulse width modulated signal from a reference signal and the sampled digital signal during each of the plurality of chaotic intervals.

9. The apparatus of claim 8, wherein the chaotic interval generator calculates maximum values of the reference signal for each of the plurality of chaotic intervals, the pulse width modulation signal generator comprises a counter to generate the reference signal from the maximum values of the reference signal and an adder to generate the pulse width modulated signal by comparing the reference signal and the sampled digital signal, the reference signal is generated by counting the maximum value of the reference signal according to a predetermined reference clock.

10. The apparatus of claim 8, wherein the reference signal is a saw tooth signal.

11. The apparatus of claim 8, wherein the sampled digital signal is a noise-shaped digital signal output from a noise shaper.

12. The apparatus of claim 8, wherein an average of the plurality of chaotic intervals is equal to one period of a single-sided pulse width modulated signal which has a regular period.

13. The apparatus of claim 8, wherein each period of the plurality of chaotic intervals is calculated using a difference between one period of a single-sided pulse width modulated signal which has a regular period and a period of each of the plurality of chaotic intervals.

14. The apparatus of claim 8, wherein the chaotic interval generator is a secondary IIR filter.

15. A computer readable recording medium containing computer readable codes to perform a method of generating a pulse width modulated signal from a sampled digital signal by chaotic modulation, the method comprising:
generating a plurality of predetermined chaotic intervals having random interval values using a chaotic interval generator; and
generating the pulse width modulated signal from a reference signal and the sampled digital signal during each of the plurality of chaotic intervals.

16. A method of generating a pulse width modulation (PWM) signal, the method comprising:
receiving a sampled data signal;
calculating a chaotic interval;
generating a reference signal corresponding to the calculated chaotic interval; and
generating a PWM signal based on the reference signal and the sampled data signal.

17. The method of claim 16, wherein the sampled data signal is a noise-shaped digital signal from a noise shaper.

18. The method of claim 16, wherein a PWM converter receives the sampled data signal.

19. A pulse width modulation (PWM) converting apparatus, comprising:
an upsampler to generate a sampled digital signal from an input stream;
a natural sampling converter to convert the sampled digital signal into a natural sampled digital signal;
a noise shaper to quantize the natural sampled digital signal to a quantized stream; and
a PWM converter to generate a digital stream from the quantized stream,
wherein the PWM converter is further configured to:
generate a plurality of predetermined chaotic intervals using a chaotic interval generator; and
generate a pulse width modulated signal from a reference signal and the sampled digital signal during each of the plurality of chaotic intervals by calculating maximum values of the reference signal for each of the plurality of chaotic intervals and generating the reference signal by counting the maximum values and generating the pulse width modulated signal by comparing the reference signal and the sampled digital signal.

* * * * *